(12) United States Patent
Cheng

(10) Patent No.: US 10,840,351 B2
(45) Date of Patent: Nov. 17, 2020

(54) TRANSISTOR WITH AIRGAP SPACER AND TIGHT GATE PITCH

(71) Applicant: International Business Machines Corporation, Armonk, NY (US)

(72) Inventor: Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/239,191

(22) Filed: Jan. 3, 2019

(65) Prior Publication Data

US 2020/0219989 A1 Jul. 9, 2020

(51) Int. Cl.
*H01L 29/51* (2006.01)
*H01L 29/66* (2006.01)

(52) U.S. Cl.
CPC ........ *H01L 29/515* (2013.01); *H01L 29/6656* (2013.01)

(58) Field of Classification Search
CPC ............................ H01L 29/515; H01L 29/6656
USPC .................................................... 257/288
See application file for complete search history.

(56) References Cited

U.S. PATENT DOCUMENTS

| 6,127,712 | A | 10/2000 | Wu |
| 6,924,180 | B2 * | 8/2005 | Quek ................. H01L 29/6653 257/E29.266 |
| 9,252,233 | B2 | 2/2016 | Hsiao et al. |
| 9,368,572 | B1 * | 6/2016 | Cheng ................. H01L 29/7827 |
| 9,748,256 | B2 | 8/2017 | Liu et al. |
| 2002/0045318 | A1 * | 4/2002 | Chen .................... H01L 29/4983 438/303 |
| 2003/0045061 | A1 * | 3/2003 | Kwon ................. H01L 29/6653 438/303 |
| 2004/0063289 | A1 * | 4/2004 | Ohta ................. H01L 21/26586 438/303 |
| 2004/0155269 | A1 * | 8/2004 | Yelehanka ........ H01L 21/76895 257/288 |
| 2006/0240632 | A1 | 10/2006 | Park et al. |
| 2007/0181950 | A1 | 8/2007 | Miyake et al. |
| 2007/0296039 | A1 * | 12/2007 | Chidambarrao ............................ H01L 21/823807 257/355 |
| 2013/0095629 | A1 * | 4/2013 | Ando ..................... H01L 29/785 438/299 |
| 2013/0248950 | A1 * | 9/2013 | Kang ....................... H01L 29/78 257/288 |
| 2017/0062211 | A1 * | 3/2017 | Lim .................. H01L 29/66545 |
| 2018/0158718 | A1 | 6/2018 | Lee et al. |

FOREIGN PATENT DOCUMENTS

WO 2017111774 A1 6/2017

* cited by examiner

*Primary Examiner* — Dzung Tran
(74) *Attorney, Agent, or Firm* — Scully, Scott, Murphy & Presser, P.C.; L. Jeffrey Kelly, Esq.

(57) ABSTRACT

A semiconductor structure is provided in which an L-shaped airgap spacer is located between a functional gate structure and a source/drain contact structure. The L-shaped airgap spacer is sandwiched between a lower dielectric material spacer that is L-shaped and an upper dielectric material spacer that is also L-shaped.

9 Claims, 6 Drawing Sheets

TRANSISTOR WITH AIRGAP SPACER AND TIGHT GATE PITCH

BACKGROUND

The present application relates to a semiconductor structure and a method of forming the same. More particularly, the present application relates to a semiconductor structure including a functional gate structure that contains an L-shaped airgap spacer laterally adjacent to each side of the functional gate structure as well as a method of forming such a semiconductor structure.

Airgap spacers are being pursued for future complementary metal oxide semiconductor (CMOS) technology to reduce parasitic capacitance between the gate electrode and the source/drain regions.

Conceptually, airgap spacers can be formed by starting with a sacrificial spacer to facilitate the formation of the transistor. The sacrificial spacer is later removed and replaced with an airgap spacer, for example, after the formation of a functional gate structure and contact structures. In practice, however, it was found that it is extremely challenging, if not possible, to find a single sacrificial spacer material to meet the following competing requirements. For example, and on one hand, the sacrificial spacer material needs to be strong enough to sustain source/drain epitaxy which involves aggressive cleaning and high temperature processing. On the other hand, the sacrificial spacer material needs to be weak enough so that it can be easily removed very selectively without impacting other essential device structures such as the high-k gate dielectric, the S/D epitaxy, and isolation structure formation.

There is thus a need for providing a semiconductor structure including an airgap spacer that is laterally adjacent to each side of the functional gate structure without exhibiting the above issues with processes in which a single sacrificial spacer material is employed to form the airgap spacer.

SUMMARY

A semiconductor structure is provided in which an L-shaped airgap spacer is located between a functional gate structure and a source/drain contact structure. The L-shaped airgap spacer is sandwiched between a lower dielectric material spacer that is L-shaped and an upper dielectric material spacer that is also L-shaped.

In one aspect of the present application, a semiconductor structure is provided. In one embodiment of the present application, the semiconductor structure includes a functional gate structure located on a channel region of a semiconductor material portion, wherein a source/drain (S/D) region is located at each end of the channel region. A contact structure is located laterally adjacent to, and on both sides of, the functional gate structure. The contact structure contacts a surface of the source/drain region. An airgap spacer is located between the functional gate structure and each contact structure. In accordance with the present application, the airgap spacer is L-shaped and is sandwiched between a lower dielectric material spacer that is L-shaped and an upper dielectric material spacer.

In another aspect of the present application, a method of forming a semiconductor structure is provided. In one embodiment of the present application, the method includes forming a bi-layer structure including an inner dielectric material structure and an outer dielectric material structure on each side of a sacrificial gate structure that is located on a semiconductor material portion. A source/drain region is then formed on each side of the sacrificial gate structure, and thereafter the outer dielectric material structure of the bi-layer structure is removed. Next, a stack of a first dielectric spacer material layer, a second dielectric spacer material layer, and a third dielectric spacer material layer is formed laterally adjacent to, and above, the sacrificial gate structure. A topmost surface of the sacrificial gate structure is physically exposed by removing portions of the first dielectric spacer material layer, the second dielectric spacer material layer and the third dielectric spacer material layer. Next, the sacrificial gate structure is removed to provide a gate cavity, and thereafter a functional gate structure is formed in the gate cavity. A contact structure is then formed contacting each source/drain region. Next, a portion of the remaining second dielectric spacer material layer is removed to provide an airgap, and thereafter the airgap is sealed with a dielectric airgap seal material to provide an airgap spacer.

DETAILED DESCRIPTION

Figure 1:
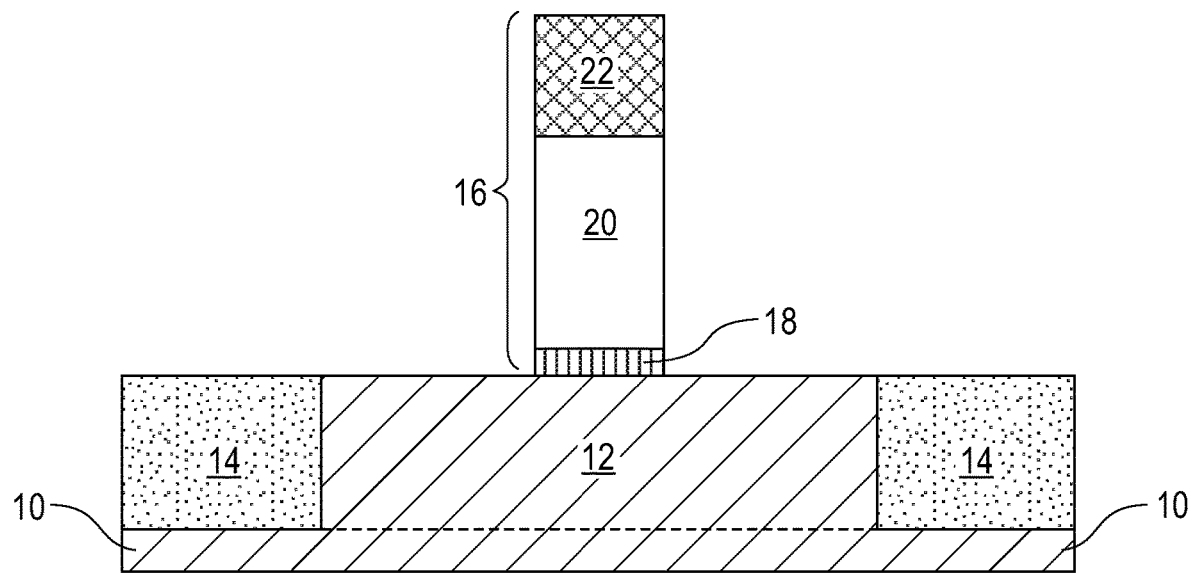
FIG. 1 is a cross sectional view of an exemplary semiconductor structure that can be employed in the present application and including a sacrificial gate structure located on a semiconductor material portion that is present on a substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present application, which will be described in greater detail herein below, decouples the formation of the airgap spacer from the formation of epitaxial source/drain regions so that the materials and processes for forming airgap spacer and epitaxial source/drain regions can be independently optimized. Furthermore, by removing all or a portion of the sacrificial spacer after the formation of epitaxial source/drain regions, it increases the spacing for the source/drain contact. The larger the source/drain contact is, the lower the contact resistance is, and the better the transistor performance is. Also, an L-shaped spacer is provided that extends to the top of an isolation structure such that the isolation structure is protected during the downstream process by the L-shape spacer.

Referring first to FIG. 1, there is illustrated an exemplary semiconductor structure that can be employed in the present application and including a sacrificial gate structure 16 located on a semiconductor material portion 12 that is present on a substrate 10. As is shown, an isolation structure 14 laterally surrounds the semiconductor material portion 12. The semiconductor structure shown in FIG. 1 can be used to form planar transistor devices or non-planar transistor devices.

Although the present application describes a single sacrificial gate structure 16 located on the semiconductor material portion 12, the present application contemplates embodiments in which a plurality of sacrificial gate structures are formed in the semiconductor material portion 12. In such an embodiment, each sacrificial gate structure can be tightly packed. That is, the pitch between each neighboring sacrificial gate structure can be less than 50 nm. In yet another embodiment of the present application, other semiconductor material portions can be located laterally adjacent to the semiconductor material portion 12 shown in FIG. 1. Each of the semiconductor material portions that are located laterally adjacent to semiconductor material portion 12 may include at least one sacrificial gate structure located thereon.

In one embodiment of the present application, substrate 10 is composed of one or more semiconductor materials having semiconducting properties. Examples of semiconductor materials that may be used as the substrate 10 include, but are not limited to, silicon (Si), a silicon germanium (SiGe) alloy, a silicon germanium carbide (SiGeC) alloy, germanium (Ge), a III/V compound semiconductor, or a II/VI compound semiconductor.

In another embodiment of the present application, substrate 10 may be composed of an insulator material. Examples of insulator materials that can be used as substrate 10 include, but are not limited to, silicon dioxide, boron nitride or a stack of, and in any order, silicon dioxide and boron nitride.

The semiconductor material portion 12 defines an area in which a functional gate structure will be subsequently formed. By "functional gate structure" it is meant a permanent gate structure used to control output current (i.e., flow of carriers in the channel) of a semiconducting device through electrical or magnetic fields. The semiconductor material portion 12 may be composed of one of the semiconductor materials mentioned above for substrate 10. In one example, the semiconductor material portion 12 is composed entirely of silicon.

In one embodiment, the semiconductor material portion 12 and the substrate 10 are both composed of semiconductor materials, and are derived from a bulk semiconductor substrate. In such an embodiment, the semiconductor material portion 12 and the substrate 10 may be composed of a same semiconductor material or compositionally different semiconductor materials. In the drawings, a dotted line is shown to represent a possible material interface that can be present between the substrate 10 and the semiconductor material portion 12.

In another embodiment, the semiconductor material portion 12 is composed of a semiconductor material, as defined above, and the substrate 10 is composed of an insulator material, as defined above. In such an embodiment, a semiconductor on-insulator substrate (SOI) can be used. A SOI substrate includes an insulator layer that is sandwiched between a topmost surface material layer and a handle substrate.

In one embodiment, the semiconductor material portion 12 may be a semiconductor fin and the substrate 10 may composed of a semiconductor material or an insulator. The term "semiconductor fin" refers to a structure composed of a semiconductor material, as defined above, that includes a pair of vertical sidewalls that are parallel to each other. A surface is "vertical" if there exists a vertical plane from which the surface does not deviate by more than three times the root mean square roughness of the surface. In one embodiment, the semiconductor fin has a height from 20 nm to 200 nm, a width from 5 nm to 30 nm, and a length from 20 nm to 200 nm. Other heights and/or widths and/or lengths that are lesser than, or greater than, the ranges mentioned herein can also be used in the present application. In such an embodiment, a single semiconductor fin or a plurality of semiconductor fins may be employed. The semiconductor fin(s) can be formed by patterning an upper portion of a bulk semiconductor substrate or by patterning of a topmost semiconductor layer of a SOI substrate, as defined above. Patterning may be performed by lithography and etching, a sidewall image transfer (SIT) process or by direct self-assembly (DSA) process in which a copolymer that is capable of direct self-assembly is used.

In a yet further embodiment of the present application, the semiconductor material portion 12 may be a semiconductor nanowire; substrate 10 could be either a semiconductor material or an insulator. The term "semiconductor nanowire" refers to a structure composed of a semiconductor material, as defined above, that has a diameter on the order of a few nanometers or less. A single semiconductor nanowire or a plurality of semiconductor nanowires may be employed. When a plurality of nanowires is employed, the nanowires may be in a vertical stacked configuration or they may be located laterally adjacent to each other. The semiconductor nanowire(s) can be formed utilizing techniques well known to those skilled in the art.

In yet another embodiment, the semiconductor material portion 12 can be a semiconductor nanosheet or a stack of spaced apart nanosheets; substrate 10 could be either a semiconductor material or an insulator. A semiconductor nanosheet is a sheet of semiconductor material whose vertical thickness that is substantially less than its width. The semiconductor nanosheet(s) can be formed utilizing techniques well known to those skilled in the art.

The isolation structure 14 is composed of a dielectric material such as, for example, silicon dioxide. In some embodiments of the present application, the isolation structure 14 may be formed by forming a trench within a bulk semiconductor substrate or an SOI substrate, and then filling the trench with a trench dielectric material such as, for example, silicon dioxide, silicon nitride, silicon oxynitride, or any suitable combination of those materials. In other embodiments of the present application, a bulk semiconductor substrate or an SOI substrate is first processed to include the semiconductor material portion 12 (e.g., semiconductor fin formation), and thereafter the isolation structure 14 can be formed utilizing a conventional deposition process such as, for example, chemical vapor deposition (CVD) or plasma enhanced chemical vapor deposition (PECVD). In some embodiments, and as shown in the drawings of the present application, the isolation structure 14 has a topmost surface that is coplanar with a topmost surface of the semiconductor material portion 12. In other embodiments, the isolation structure 14 may has a topmost surface that is located beneath, or above, the topmost surface of the semiconductor material portion 12.

The sacrificial gate structure 16 is used in the present application as a placeholder structure for a functional gate structure. The sacrificial gate structure 16 may include a single sacrificial material or a stack of two or more sacrificial materials (i.e., the sacrificial gate structure includes at least one sacrificial material). In one embodiment and as is illustrated in FIG. 1, the sacrificial gate structure 16 includes, from bottom to top, a sacrificial gate dielectric material 18, a sacrificial gate material 20 and a sacrificial dielectric cap 22. In some embodiments, the sacrificial gate dielectric material 18 and/or the sacrificial dielectric cap 22 can be omitted and only a sacrificial gate material 20 is formed.

The sacrificial gate structure 16 can be formed by forming a blanket layer (or layers) of a material (or various materials) and then patterning the material (or various materials) by lithography and etching. In one embodiment, sacrificial gate structure 16 can be formed by first depositing a blanket layer of a sacrificial gate dielectric material 18. The sacrificial gate dielectric material 18 can be an oxide, nitride, and/or oxynitride. In one example, the sacrificial gate dielectric material 18 can be a high dielectric constant (k) material having a dielectric constant greater than 4.0. In some embodiments, a multilayered dielectric structure comprising different dielectric materials, e.g., silicon dioxide, and a high k dielectric can be formed and used as the sacrificial gate dielectric material 18. The sacrificial gate dielectric material 18 can be formed by any deposition technique including, for example, chemical vapor deposition (CVD), plasma enhanced chemical vapor deposition (PECVD), physical vapor deposition (PVD), sputtering, or atomic layer deposition.

A blanket layer of a sacrificial gate material 20 can be formed on the blanket layer of sacrificial gate dielectric material 18. The sacrificial gate material 20 can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material 20 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

A blanket layer of a sacrificial gate cap material 22 can be formed on the blanket layer of sacrificial gate material 20. The sacrificial gate cap material 22 may include a hard mask material such as, for example, silicon dioxide and/or silicon nitride. The sacrificial gate cap material 22 can be formed by any suitable deposition process such as, for example, chemical vapor deposition (CVD) or plasma enhanced chemical vapor deposition (PECVD).

After providing the above mentioned sacrificial material stack (or any subset of the sacrificial materials), patterning techniques such as lithography followed by etching can be used to pattern the sacrificial material stack (or any subset of the sacrificial materials) and to provide the sacrificial gate structure 16. Alternatively, the sacrificial gate structure 16 can be formed by a self-aligned double patterning technique such as sidewall image transfer (SIT). It is noted that in embodiments in which the semiconductor material portion 12 is a semiconductor fin, a semiconductor nanowire, or a semiconductor nanosheet, the sacrificial gate structure 16 is present on at least a topmost surface and sidewalls of the semiconductor fin, the semiconductor nanowire, or the semiconductor nanosheet.

Figure 2:
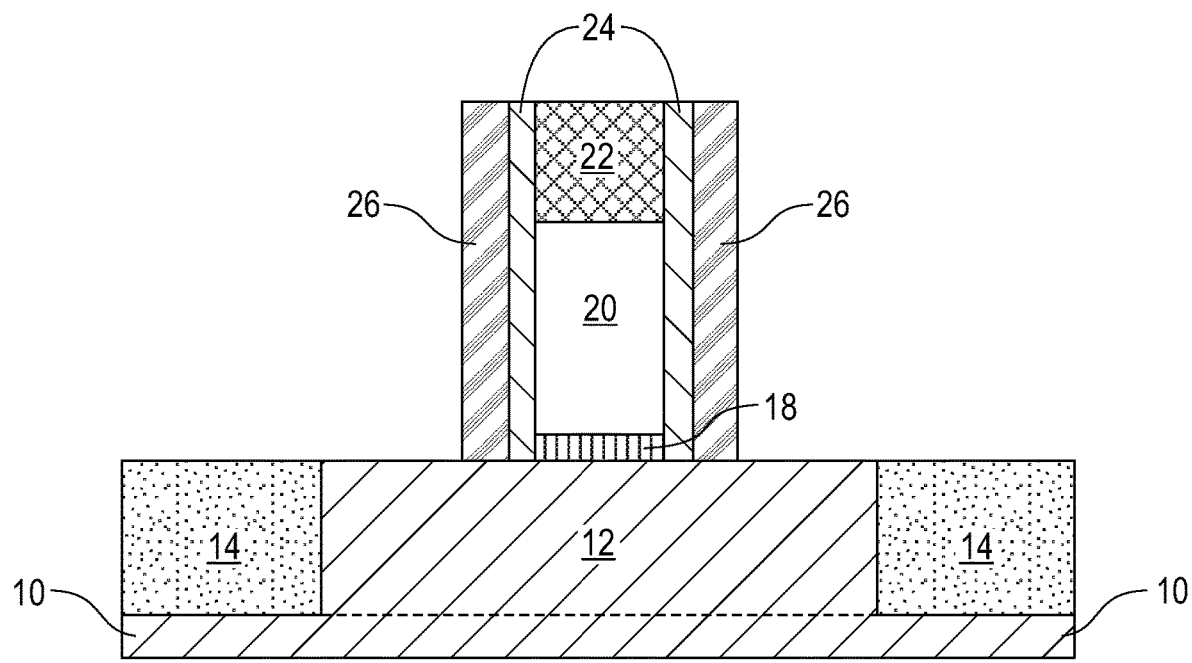
FIG. 2 is a cross sectional view of the exemplary semiconductor structure of FIG. 1 after forming a bi-layer structure including an inner dielectric material structure and an outer dielectric material structure on each side of the sacrificial gate structure.

Referring now to FIG. 2, there is illustrated the exemplary semiconductor structure of FIG. 1 after forming a bi-layer structure including an inner dielectric material structure 24 and an outer dielectric material structure 26 on each side of the sacrificial gate structure 16. In one embodiment, the inner dielectric material structure 24 and the outer dielectric material structure 26 that provide the bi-layer structure are both I-shaped. By "I-shaped" it is meant a material or structure that contains only a vertical component which extends upward from a horizontal surface of the semiconductor material portion 12. In one embodiment of the present application, the inner dielectric material structure 24 and the outer dielectric material structure 26 have topmost surfaces that are coplanar to each other as well as being coplanar with a topmost surface of the sacrificial gate structure 16.

The inner dielectric material structure 24 has a first sidewall that directly contacts a sidewall of the sacrificial gate structure 16, and a second sidewall, that is opposite to the first sidewall, that directly contacts a first sidewall of the outer dielectric material structure 26; the second sidewall of the outer dielectric material structure 26, which is opposite the first sidewall of the outer dielectric material structure 26, is physically exposed at this point of the present application.

In some embodiments, the inner dielectric material structure 24 is composed of a first dielectric material, and the outer dielectric material structure 26 is composed of a second dielectric material that is compositionally different from, and more robust than, the first dielectric material. By "more robust" it is meant that the second dielectric material that provides the outer dielectric material structure 26 can withstand the conditions that are employed in a subsequent epitaxial growth process that is employed to form source/drain regions.

In one embodiment of the present application, the first dielectric material that provides the inner dielectric material structure 24 is a low dielectric constant dielectric material (i.e., a dielectric having a dielectric constant of less than 4.0), while the second dielectric material that provides the outer dielectric material structure 26 is a dielectric material that has a dielectric constant of 4.0 or above. In one example, the inner dielectric material structure 24 may be composed of a dielectric material containing atoms of Si, O, B, C and N, while the outer dielectric material structure 26 is composed of silicon nitride.

In some embodiments, the outer dielectric material structure 26 and the sacrificial gate cap material 22 are both composed of a same dielectric material, such as, for example, silicon nitride.

The inner dielectric material structure 24 has a first width, and the outer dielectric material structure 26 has a second width that may be the same as, or different from, the first width. In one embodiment, the second width of the outer dielectric material structure 26 is greater than the first width of the inner dielectric material structure 24. In such an embodiment, the first width of the inner dielectric material structure 24 may be from 0.5 nm to 5 nm, while the second width of the outer dielectric material structure 26 from 3 nm to 10 nm.

In accordance with an embodiment of the present application, the inner dielectric material structure 24 is formed first, followed by the formation of the outer dielectric material structure 26. Notably, the inner dielectric material structure 24 is formed by depositing the first dielectric material and then performing a first directional etching process (i.e., a reactive ion etch), and then the outer dielectric material structure 26 is formed by depositing the second dielectric material and then performing a second directional etching process (i.e., a reactive ion etch).

Alternatively, the inner dielectric material structure 24 has a "L-shape" and the outer dielectric material structure 26 has an "I-shape"; this embodiment is not illustrated in the drawings of the present application. The process flow for forming such a bi-layer structure is as follows. First dielectric deposition, second dielectric deposition, directional etch (e.g., by RIE (reactive ion etch) of the second dielectric followed by directional etch of the first dielectric.

Figure 3:
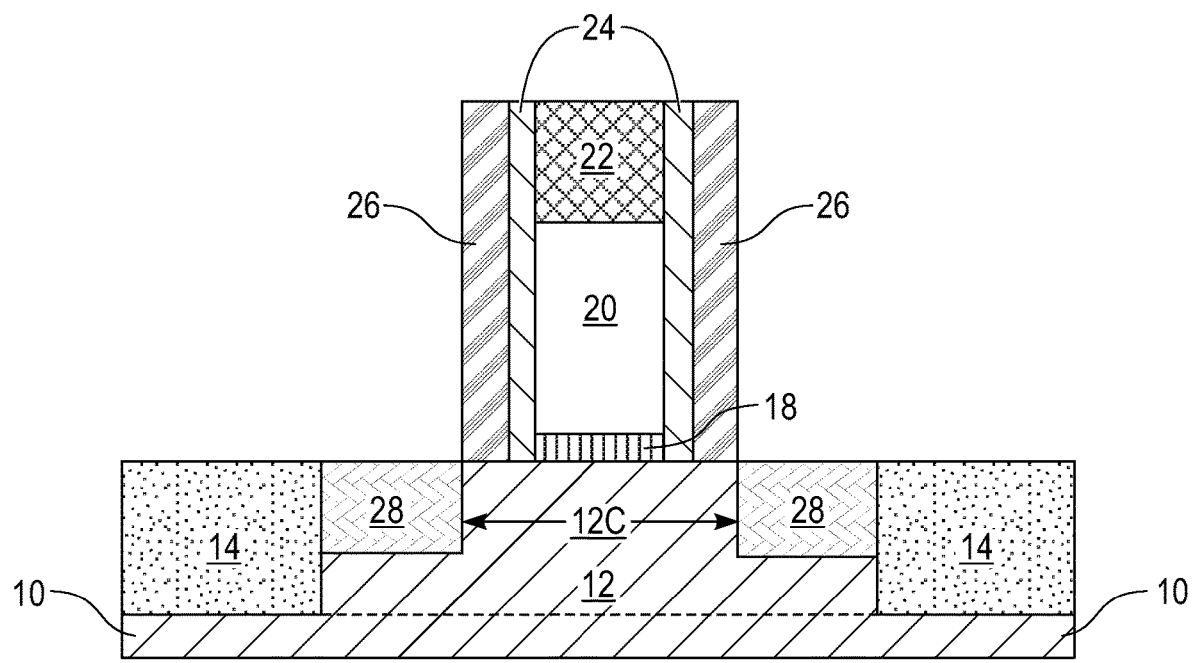
FIG. 3 is a cross sectional view of the exemplary semiconductor structure of FIG. 2 after forming a source/drain region on each side of the sacrificial gate structure.

Referring now to FIG. 3, there is illustrated the exemplary semiconductor structure of FIG. 2 after forming a source/drain (S/D) region 28 on each side of the sacrificial gate structure 16. One of the source/drain regions serves as a source region of the functional gate structure to be subsequently formed, and the other source/drain regions serves as a drain region of the functional gate structure to be subsequently formed. The region of semiconductor material portion 12 that is located laterally between the source region and the drain region may be referred to as a channel region 12C.

The S/D regions 28, which include a p-type doped or n-type doped semiconductor material, can be formed by first forming a S/D trench into the semiconductor material portion 12 and on both side of the sacrificial gate structure 16 by etching utilizing the bi-layer structure (24, 26) as an etch mask. The semiconductor material that is present in the S/D regions 28 may be the same as, or compositionally different from, the semiconductor material that provides the semiconductor material portion 12. The etch may be a dry etch, a chemical wet etch, or a combination of both. A semiconductor material (doped or un-doped, i.e., intrinsic) is then formed into each of the S/D trenches utilizing an epitaxial growth process. The trenches may be precleaned prior to epitaxial growth, and a high temperature (greater than 550° C.) hydrogen prebake may be employed. The outer dielectric material structure 26 and, if present, the sacrificial gate cap material 22, protect the sacrificial gate material 20 and, if present, the sacrificial gate dielectric material 18, of the sacrificial gate structure 16 during the formation of the S/D regions 28.

The term "epitaxial growth" means the growth of a second semiconductor material on a growth surface of a first semiconductor material, in which the second semiconductor material being grown has the same crystalline characteristics as the first semiconductor material. In an epitaxial deposition process, the chemical reactants provided by the source gases are controlled and the system parameters are set so that the depositing atoms arrive at the growth surface of the first semiconductor material with sufficient energy to move around on the growth surface and orient themselves to the crystal arrangement of the atoms of the growth surface. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of the of the semiconductor material that provides the S/D regions 28 can be performed utilizing any well known precursor gas or gas mixture. Carrier gases like hydrogen, nitrogen, helium and argon can be used. In some embodiments, the n-type dopant or p-type dopant is introduced into the precursor gas or gas mixture. In other embodiments, the n-type dopant or p-type dopant is introduced into an intrinsic semiconductor material that is epitaxially grown into each S/D trench. In such an embodiment, gas phase doping or ion implantation may be used to introduce the dopant into the intrinsic semiconductor material.

The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, the S/D regions 28 may have a dopant concentration of from $4\times10^{20}$ atoms/cm$^3$ to $3\times10^{21}$ atoms/cm$^3$.

As is shown in the embodiment illustrated in FIG. 3, each S/D region 28 has a first sidewall that is vertically aligned to the physically exposed sidewall of the outer dielectric material structure 26, and a second sidewall, opposite the first sidewall, the directly contacts a sidewall of the isolation structure 14. The S/D sidewall does not necessarily have to vertically aligned to the sidewall of the outer dielectric material 26. For example, after S/D trench formation, but before S/D epitaxy growth, the S/D region can be laterally etched (not shown) so that the S/D epitaxy can be placed closer to the channel region. The lateral etch can even be a crystalline orientation dependent etch such that, after the lateral etch, the S/D recess has a sigma shape to enhance the strain effect from the epitaxial S/D region 28 to the channel region.

Figure 4:
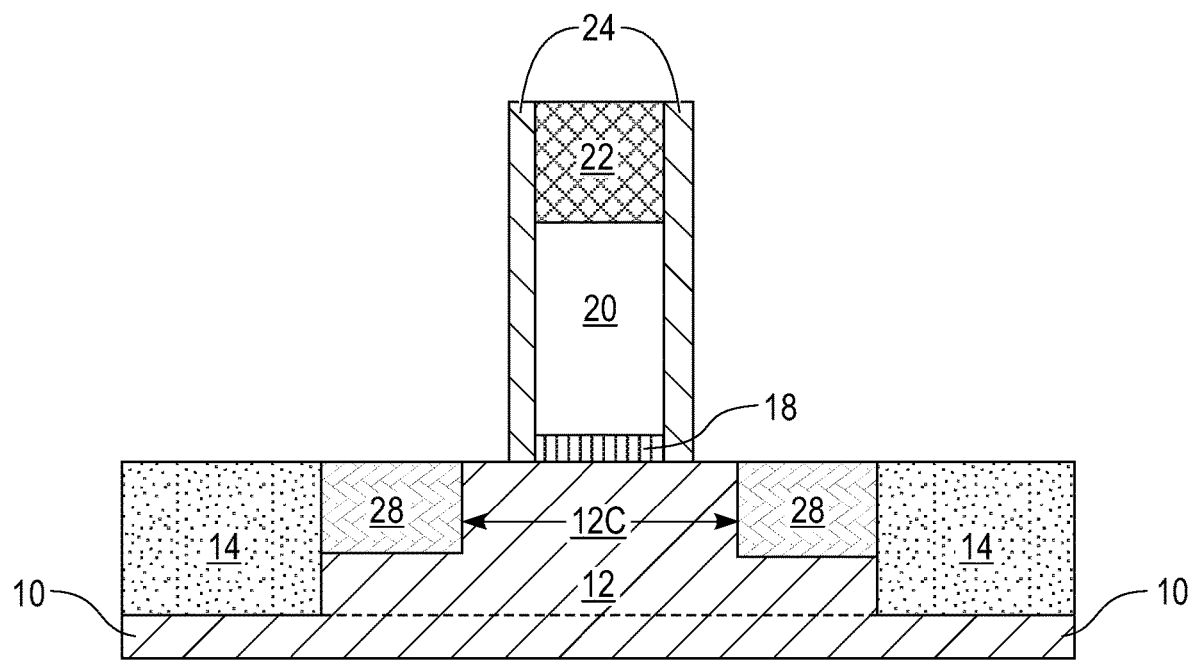
FIG. 4 is a cross sectional view of the exemplary semiconductor structure of FIG. 3 after removing the outer dielectric material structure.

Referring now to FIG. 4, there is illustrated the exemplary semiconductor structure of FIG. 3 after removing the outer dielectric material structure 26, while maintaining the inner dielectric material structure 24. In some embodiments (not shown), both the outer dielectric material structure 26 and the inner dielectric material structure 24 can be removed at this point of the present application. During the removal of the outer dielectric material structure 26, an uppermost portion of the sacrificial gate cap material 22 may also be removed. The amount of the sacrificial gate cap material 22 that is removed is negligible since the outer dielectric material structure 26 is thin as compared to the sacrificial gate cap material 22. During the removal of the outer dielectric material structure 26, the inner dielectric material structure 24 protects the sacrificial gate structure 16 thus the gate profile of the sacrificial gate structure 16 is maintained.

The outer dielectric material structure 26 can be removed utilizing an etching process that selectively removes the outer dielectric material structure 26. In one embodiment, and when silicon nitride is used as the outer dielectric material structure 26, hot phosphoric acid is used. In embodiments in which the inner dielectric material structure 24 is also removed, an etching process that is selective in removing the inner dielectric material structure 24 may be employed. In some embodiments, the width of the inner dielectric material structure 24 may be reduced (i.e., trimmed) by etching, or a combination of oxidation and etching to provide an inner dielectric material structure 24 have a trimmed width that is less than the initial width, (i.e., the first width) of the inner dielectric material structure 24.

Figure 5:
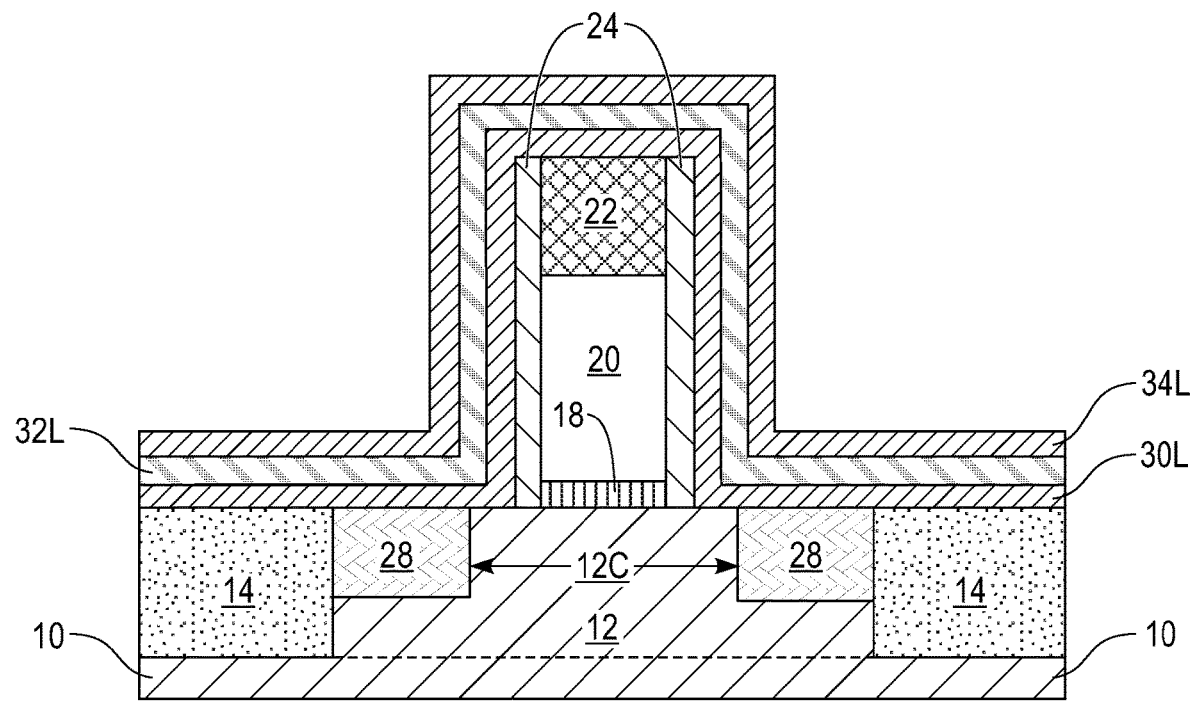
FIG. 5 is a cross sectional view of the exemplary semiconductor structure of FIG. 4 after forming a stack of a first dielectric spacer material layer, a second dielectric spacer material layer and a third dielectric spacer material layer.

Referring now to FIG. 5, there is illustrated the exemplary semiconductor structure of FIG. 4 after forming a stack of a first dielectric spacer material layer 30L, a second dielectric spacer material layer 32L and a third dielectric spacer material layer 34L. The first dielectric spacer material layer 30L, the second dielectric spacer material layer 32L and the third dielectric spacer material layer 34L are formed laterally adjacent to, and above, the sacrificial gate structure 16.

The first dielectric spacer material layer 30L is composed of a first dielectric spacer material, the second dielectric spacer material layer 32L is composed of a second dielectric spacer material, and the third dielectric spacer material layer 34L is composed of a third dielectric spacer material. In accordance with the present application, the second dielectric spacer material must be compositionally different from both the first and third dielectric spacer materials such that it has a different etch rate in a given etchant as compared to the first and third dielectric spacer materials. The first and third dielectric spacer materials may be compositionally the same, or they may be compositionally different. In one example, the first and third dielectric spacer materials that provide the first and third dielectric spacer material layers (30L, 34L) are composed of silicon nitride, while the second spacer material that provides the second dielectric material spacer 32L is composed of a silicon oxide. In another example, the first dielectric spacer material that provides the first dielectric spacer material layer 30L is composed of silicon, boron, carbon, nitrogen (SiBCN), the third dielectric spacer material that provides the third dielectric spacer material layer 34L is composed of silicon nitride, while the second spacer material that provides the second dielectric material spacer 32L is composed of a silicon oxide.

The first dielectric spacer material layer 30L has a first thickness, the second dielectric spacer material layer 32L has a second thickness, and the third dielectric spacer material layer 34L has a third thickness. In accordance with the present application, the first thickness may be the same as, or different from, the second thickness and/or the third thickness. In one embodiment, the first thickness, the second thickness and the third thickness of the first dielectric spacer material layer 30L, the second dielectric spacer material layer 32L and the third dielectric spacer material layer 34L, respectively, are the same. In any embodiment, the first thickness, the second thickness and the third thickness of the first dielectric spacer material layer 30L, the second dielectric spacer material layer 32L and the third dielectric spacer material layer 34L, respectively, can range from 1 nm to 5 nm.

The first dielectric spacer material layer 30L, the second dielectric spacer material layer 32L and the third dielectric spacer material layer 34L are formed utilizing sequential deposition processes such as, for example, CVD, PECVD or PVD.

Figure 6:
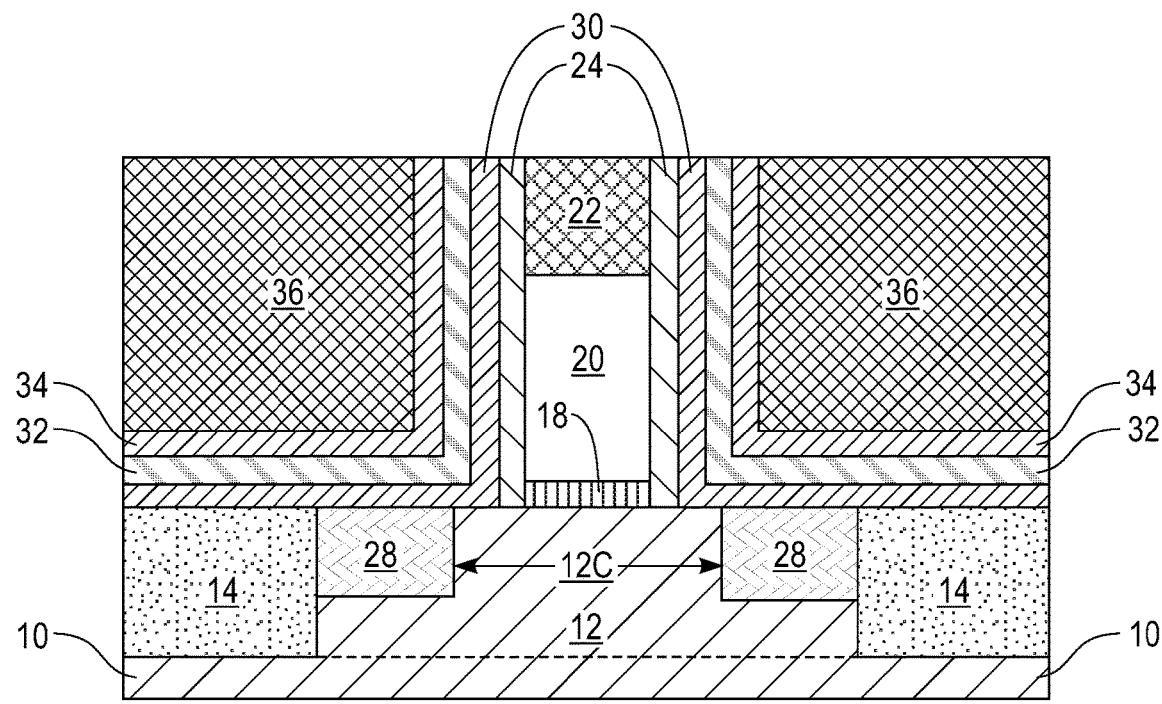
FIG. 6 is a cross sectional view of the exemplary semiconductor structure of FIG. 5 after forming an interlayer dielectric (ILD) material and physically exposing a topmost surface of the sacrificial gate structure.

Referring now to FIG. 6, there is illustrated the exemplary semiconductor structure of FIG. 5 after forming an interlayer dielectric (ILD) material 36 and physically exposing a topmost surface of the sacrificial gate structure 16.

The ILD material 36 is composed of a dielectric material that is compositionally different from the first dielectric spacer material layer 30L, the second dielectric spacer material layer 32L and the third dielectric spacer material layer 34L. Examples of dielectric materials that can be used for ILD material 36 include silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0. In one embodiment, the ILD material 36 can be formed by a deposition process such as, for example, chemical vapor deposition (CVD), plasma enhanced chemical vapor deposition (PECVD), evaporation or spin-on coating. Following the deposition of the ILD material 36, a planarization process such as, for example, chemical mechanical polishing (CMP) and/or grinding, is employed to physically expose the topmost surface of the sacrificial gate structure.

During the planarization process, portions of each of the first dielectric spacer material layer 30L, the second dielectric spacer material layer 32L and the third dielectric spacer material layer 34L that are located above the sacrificial gate structure 16 are removed. The remaining portion of the first dielectric spacer material layer 30L that is located on each side of the sacrificial gate structure 16 is referred herein as a first dielectric spacer 30, the remaining portion of the second dielectric spacer material layer 32L that is located on each side of the sacrificial gate structure 16 is referred herein as a second dielectric spacer 32, while the remaining portion of the third dielectric spacer material layer 34L that is located on each side of the sacrificial gate structure 16 is referred herein as a third dielectric spacer 34. At this point of the present application, each of the first dielectric spacer 30, the second dielectric spacer 32, and the third dielectric spacer 34 is L-shaped. By "L-shaped" it is meant that a material or structure has a vertical portion and a single horizontal portion that extends laterally outward in a single direct from a lower portion of the vertical portion.

At this point of the present application, each of the first dielectric spacer 30, the second dielectric spacer 32, and the third dielectric spacer 34 has a topmost surface that is coplanar with each other, as well as being coplanar with a topmost surface of the ILD material 36 and a topmost surface of the sacrificial gate structure 16.

In the present application, the second dielectric spacer 32 is a sacrificial spacer that will be removed in a later processing step to provide an airgap spacer. The first and third dielectric spacers (30, 34) protect the second dielectric spacer 32, the isolation structure 14, the S/D regions 28, and the later formed gate dielectric material of the functional gate structure during downstream processing.

Figure 7:
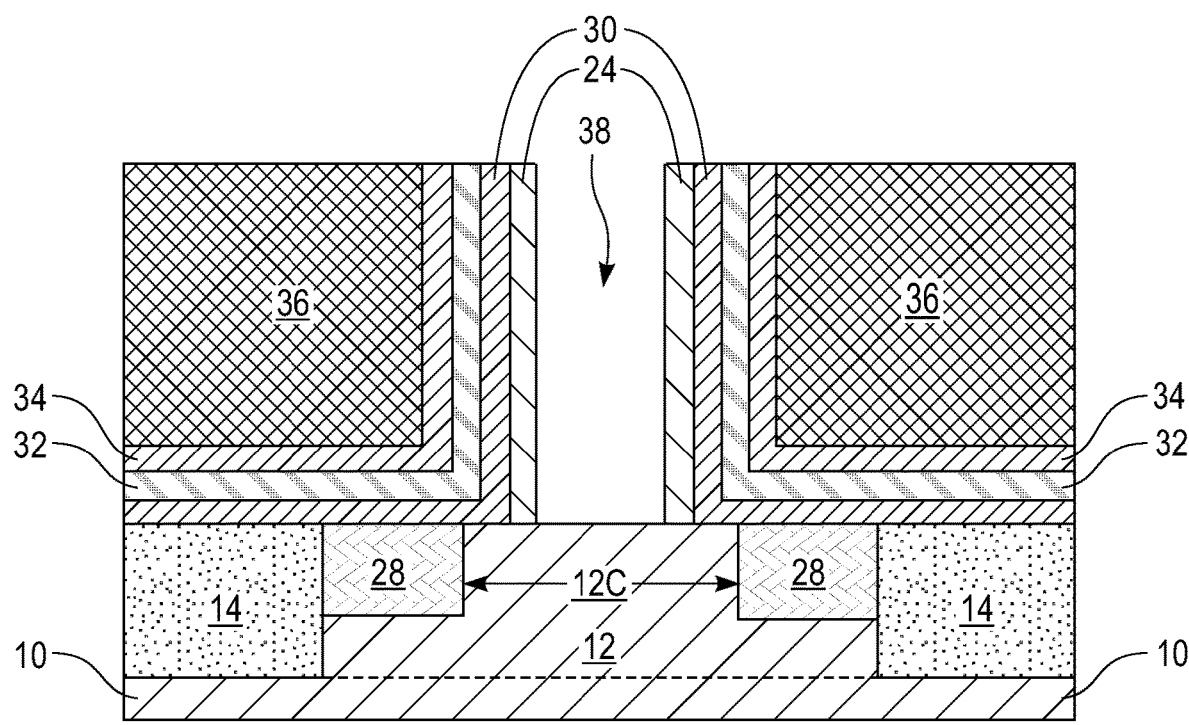
FIG. 7 is a cross sectional view of the exemplary semiconductor structure of FIG. 6 after removing the sacrificial gate structure to provide a gate cavity.

Referring now to FIG. 7, there is illustrated the exemplary semiconductor structure of FIG. 6 after removing the sacrificial gate structure 16 to provide a gate cavity 38. The sacrificial gate structure 16 may be removed utilizing one or more anisotropic etching processes that is(are) selective in removing the material or materials of the sacrificial gate structure 16. In one embodiment, one or more reactive ion etching processes are used to remove the sacrificial gate structure 16. The gate cavity 38 defines an area in which a functional gate structure will be formed. In the illustrated embodiment, the gate cavity 38 is defined as the area that is located between two neighboring inner dielectric material structures 24. In another embodiment in which the inner dielectric material structure 24 has been removed, the gate cavity 38 is defined by the area between the vertical portions of two neighboring first dielectric spacers 30.

Figure 8:
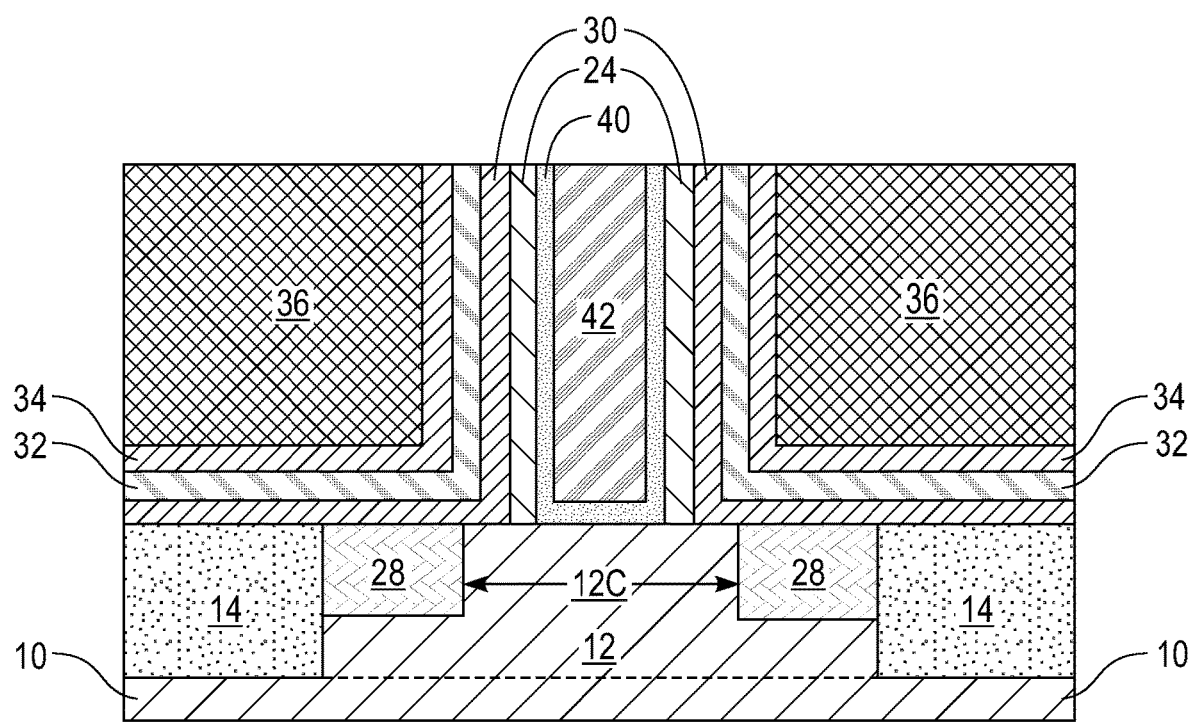
FIG. 8 is a cross sectional view of the exemplary semiconductor structure of FIG. 7 after forming a gate dielectric material layer and a gate electrode material in the gate cavity.

Referring now to FIG. 8, there is illustrated the exemplary semiconductor structure of FIG. 7 after forming a gate dielectric material layer 40 and a gate electrode material 42 in the gate cavity 38. In some embodiments, the gate electrode 42 may include a work function setting layer.

The gate dielectric material layer 40 is composed of a gate dielectric material such as, for example, an oxide, nitride, and/or oxynitride. In one example, the gate dielectric material that provides the gate dielectric material layer 40 can be composed of a high-k material having a dielectric constant greater than 4.0. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric material layer 40. In one embodiment, the gate dielectric material layer 40 can have a thickness in a range from 1 nm to 10 nm. Other thicknesses that are lesser than, or greater than, the aforementioned thickness range can also be employed for the gate dielectric material layer 40.

The gate electrode material 42 may be composed of a conductive material such as, for example, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g., $Ti_3Al$, ZrAl), TaC, TaMgC, carbon nanotube, conductive carbon, graphene, or any suitable combination of these materials. The conductive material may further comprise dopants that are incorporated during deposition.

In some embodiments, the gate electrode material 42 further comprises a work function setting layer may be formed between the gate dielectric material layer 40 and the rest of the gate electrode material 42. When present, the work function setting layer is composed of any suitable work function metal (WFM) containing material. Illustrative examples of WFM containing materials that can be employed include, but are not limited to, a nitride, such as, for example, titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN), a carbide, such as, for example, titanium carbide (TiC), titanium aluminum carbide (TiAlC), tantalum carbide (TaC), hafnium carbide (HfC), and combinations thereof. In one embodiment, a first work function setting layer is provided to the first gate structure that provides a first threshold voltage to the first gate structure, and a second work function setting layer is provided to the second gate structure that provides a second threshold voltage to the second gate structure that is different from the first threshold voltage. In one embodiment, the work function setting layer can have a thickness in a range from 3 nm to 10 nm. Other thicknesses that are lesser than, or greater than, the aforementioned thickness range can also be employed for the work function setting layer.

The structure shown in FIG. 8 can be formed by first depositing a gate dielectric material layer, optionally depositing the work function setting layer, and then depositing the gate electrode material. A planarization process follows the deposition of the gate electrode material.

At this stage of the present application, the gate dielectric material layer 40 and, if present, the work function setting layer are U-shaped. By "U-shaped" it is meant a material or structure has a horizontal portion and a vertical portion that extends upward from each end of the horizontal portion. The gate dielectric material layer 40 and, if present, the work function setting layer have topmost surfaces that are coplanar with each other as well as being coplanar with a topmost surface of the gate electrode material 42 and the ILD material 36.

Figure 9:
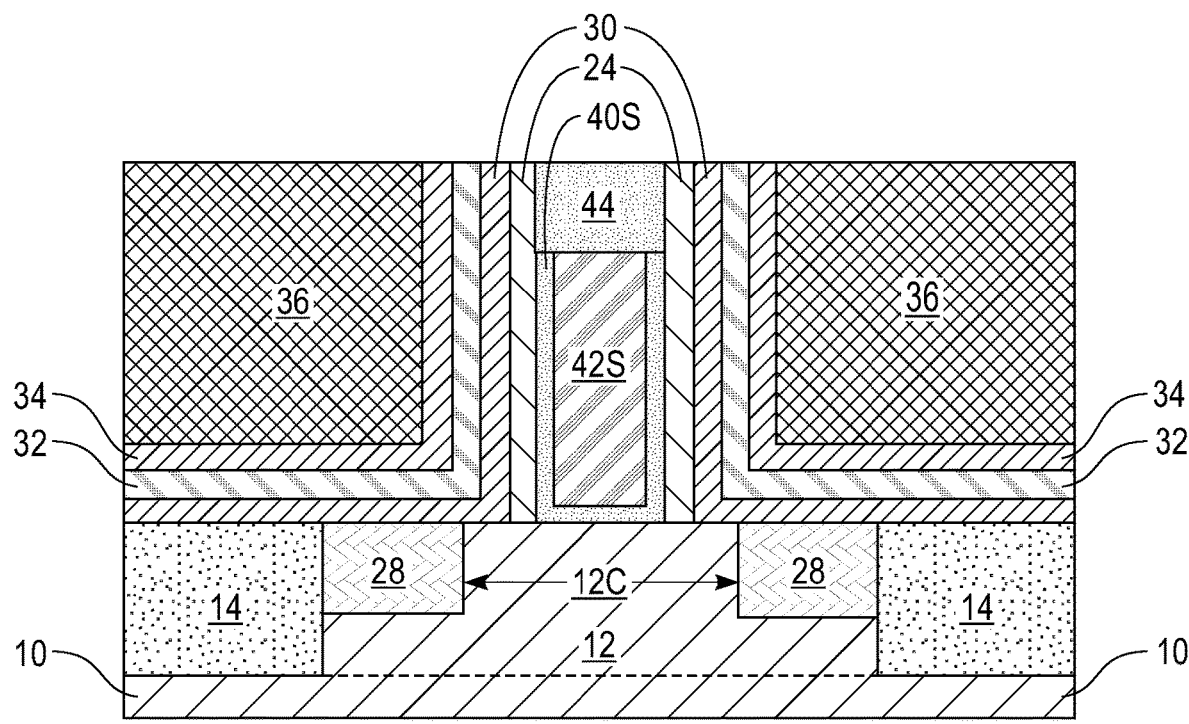
FIG. 9 is a cross sectional view of the exemplary semiconductor structure of FIG. 8 after recessing the gate dielectric material layer and the gate electrode material, and forming a gate cap on the recessed gate dielectric material layer and the recessed gate electrode material.

Referring now to FIG. 9, there is illustrated the exemplary semiconductor structure of FIG. 8 after recessing the gate dielectric material layer 40 and the gate electrode material 42, and forming a gate cap 44 on the recessed gate dielectric material layer (i.e., the gate dielectric material structure 40S) and the recessed gate electrode material (i.e., the gate electrode structure 42S). In some embodiments, and if present, the work function setting layer is also recessed at this point of the present application. The recessed work function setting layer may be referred to herein as a work function material structure. In some embodiments, this recessing step and formation of the gate cap 44 may be omitted.

Collectively, the gate dielectric material structure 40S, if present the recessed work function setting structure, and the gate electrode structure 42 provide a functional gate structure of the present application. In some embodiments and when this step of the present application is omitted, the functional gate structure may be defined by the non-recessed gate dielectric material layer 40, if present the non-recessed work function setting layer, and the non-recessed gate electrode 42.

In the illustrated embodiment, recessing may be performed utilizing one or more recess etching process. Following the one or more recess etching processes, gate cap 44 is formed by deposition of a hard mask material such as, for example, silicon nitride. A planarization process may follow the deposition of the hard mask material.

In the illustrated embodiment, the gate dielectric material structure 40S, and, if present, the recessed work function setting structure are U-shaped and have topmost surfaces that are coplanar with each other as well as being coplanar with a topmost surface of the gate electrode structure 42S. As is shown in FIG. 9, the gate cap 44 has a bottommost surface that contacts an entirety of the topmost surface of the recessed functional gate structure (i.e., 40S, and 42S), and a topmost surface that is coplanar with a topmost surface of each of the inner dielectric material structure 24, the first dielectric spacer 30, the second dielectric spacer 32, the third dielectric spacer 34 and the ILD material 36.

Figure 10:
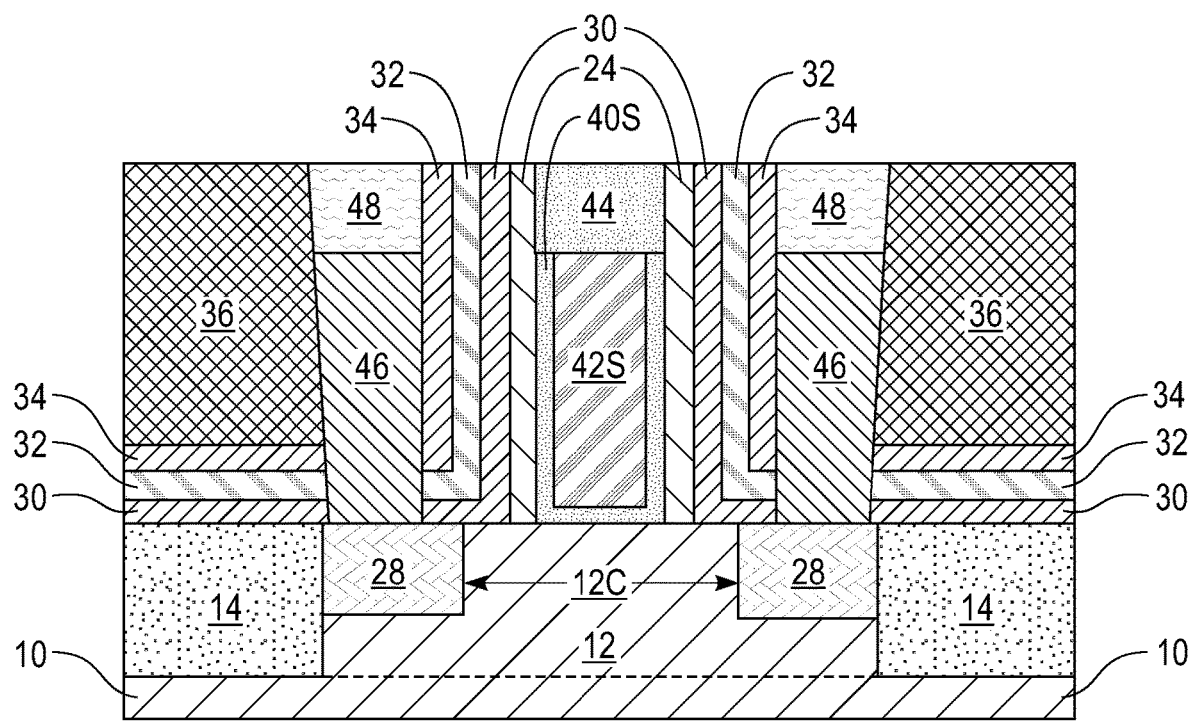
FIG. 10 is a cross sectional view of the exemplary semiconductor structure of FIG. 9 after forming a contact structure contacting each source/drain region.

Referring now to FIG. 10, there is illustrated the exemplary semiconductor structure of FIG. 9 after forming a contact structure 46 contacting each source/drain region 28. Each contact structure 46 may include a dielectric cap 48. In some embodiments, the dielectric cap 48 can be omitted.

Each contact structure 46 can be formed by providing a contact opening in the structure shown in FIG. 9 that extends to a topmost surface of a S/D region 28. The contact opening can be formed by lithography and etching. The contact opening passes through a portion of the ILD material 36, the third spacer 34, the second spacer 32, and the first spacer 30. Each contact opening is then filled with a contact metal or metal alloy. Examples of contact metals include, but are not limited to, tungsten (W), aluminum (Al), copper (Cu), or cobalt (Co). An example of a contact metal alloy is Cu—Al alloy. In some embodiments, each contact structure can further include a barrier layer between the ILD and the rest of the contact material. The barrier layer can be titanium nitride (TiN), tantalum nitride (TaN), hafnium nitride (HfN), niobium nitride (NbN), tungsten nitride (WN), tungsten carbon nitride (WCN), or combinations thereof, where the barrier layer can prevent diffusion and/or alloying of the metal contact fill material with the top source drain material, and/or anode/cathode material. In various embodiments, the barrier layer can be deposited in the trench(es) by ALD, CVD, MOCVD, PECVD, or combinations thereof. A planarization process may follow the filling of each contact opening with the contact metal or metal alloy to provide a contact structure 46. The contact structure 46 can, in some instances, be recessed and thereafter dielectric cap 48 is formed upon the recessed contact structure. The dielectric cap 48 may include a same hard mask material as the gate cap 44.

Figure 11:
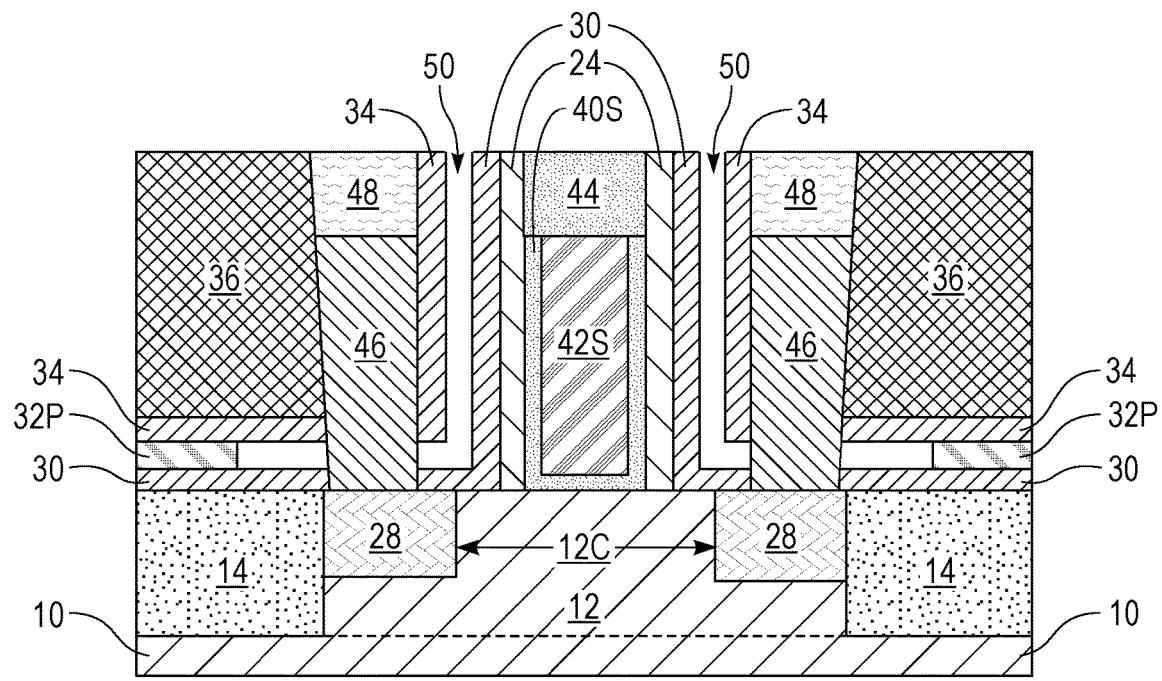
FIG. 11 is a cross sectional view of the exemplary semiconductor structure of FIG. 10 after removing a portion of the remaining second dielectric spacer material layer to provide an airgap.

Referring now to FIG. 11, there is illustrated the exemplary semiconductor structure of FIG. 10 after removing a portion of the remaining second dielectric spacer material layer (i.e., the second dielectric spacer 32) to provide an airgap 50. Airgap 50 is L-shaped and is sealed at one end by a remaining horizontal portion of the second dielectric spacer 30 (hereinafter first airgap spacer cap 32P). The airgap is located between the first dielectric spacer 30 and the third dielectric spacer 34.

An isotropic etching process can be used to selectively remove a portion of the second dielectric spacer 32 from the structure, while not removing any other element of the exemplary structure shown in FIG. 11. A majority of the airgap 50 is located between the contact structures 48 and the functional gate structure, and a small portion of the airgap 50 may extend beyond the outermost sidewall of the contact structure 48.

Figure 12:
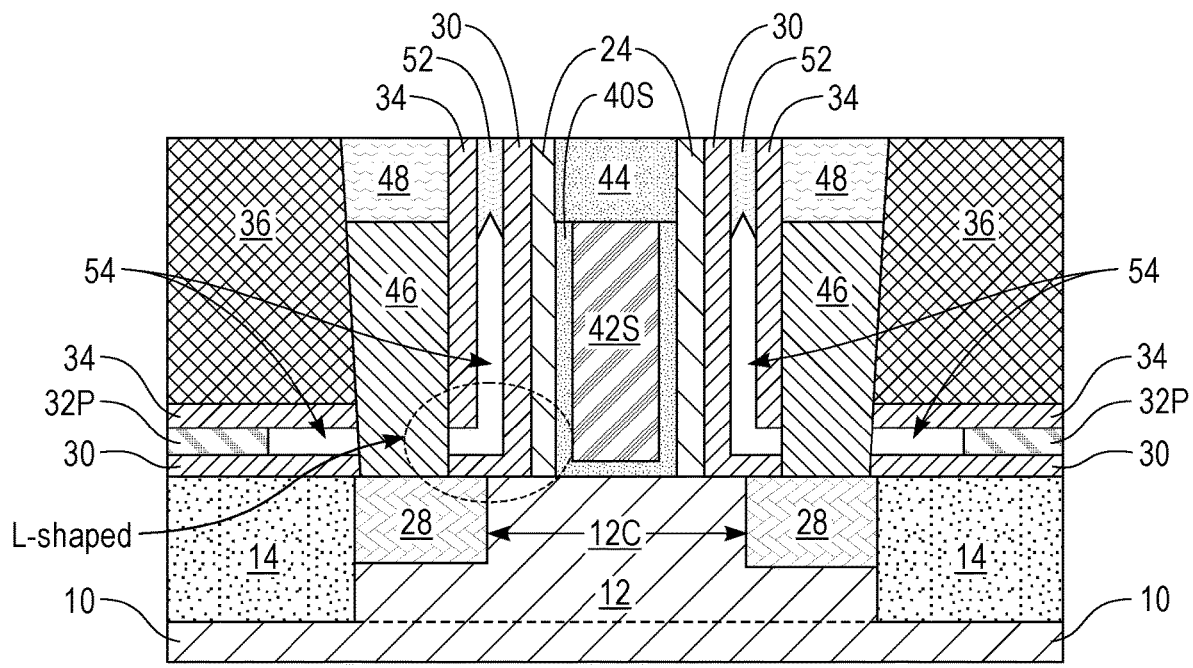
FIG. 12 is a cross sectional view of the exemplary semiconductor structure of FIG. 11 after sealing the airgap with a dielectric airgap seal material to provide an airgap spacer.

Referring now to FIG. 12, there is illustrated the exemplary semiconductor structure of FIG. 11 after sealing the airgap 50 with a dielectric airgap seal material 52 to provide an airgap spacer 54. The dielectric airgap seal material 52 forms a second airgap spacer cap. The dielectric airgap seal material 52 may be composed of a dielectric material that includes atoms of Si, O and C. Other dielectric materials may also be used as the dielectric airgap seal material 52. The dielectric airgap seal material 52 pinches off at the top of the airgap 50 and can be formed utilizing any deposition process that allows such a pinch-off to occur. The dielectric airgap seal material 52 has a topmost surface that is coplanar with the first and third dielectric spacers (30, 34) and a bottommost surface that is typically not planar from one end to the other. The airgap spacer 52 that is formed is L-shaped. A majority of the airgap spacer 52 is located between the contact structures 48 and the functional gate structure, and a small portion of the airgap spacer 52 may extend beyond the outermost sidewall of the contact structure 48.

Notably, FIG. 12 illustrates an exemplary semiconductor structure in accordance with an embodiment of the present application. The exemplary semiconductor structure includes a functional gate structure (40S, 42S) located on a channel region 12C of a semiconductor material portion 12, wherein a source/drain (S/D) region 28 is located at each end of the channel region 12C. A contact structure 46 is located laterally adjacent to, and on both sides of the functional gate structure (40S, 42S), wherein the contact structure 46 contacts a surface of the source/drain region 28. An airgap spacer 52 is located between the functional gate structure (40S, 42S) and the contact structure 46. The airgap spacer 52 is L-shaped and is sandwiched between a lower dielectric material spacer (i.e., the first dielectric spacer 30) that is L-shaped and an upper dielectric material spacer (i.e., the third dielectric spacer 34). The upper dielectric spacer (i.e., the third dielectric spacer 34 is also L-shaped. In some embodiments, a vertical portion of the upper dielectric material spacer (i.e., the third dielectric spacer 34) directly contacts a sidewall of the contact structure 48. As is shown, a horizontal portion of the lower dielectric material spacer (i.e., the first dielectric spacer 30) is adjacent to a bottom portion of the functional gate structure (40S, 42S) and extends onto a portion of the S/D region 28.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:
1. A semiconductor structure comprising:
a functional gate structure located on a channel region of a semiconductor material portion, wherein a source/drain (S/D) region is located at each end of the channel region;

a contact structure located laterally adjacent to, and on both sides of, the functional gate structure, wherein the contact structure contacts a surface of the source/drain region; and an airgap spacer located between the functional gate structure and the contact structure, wherein the airgap spacer is L-shaped and is sandwiched between a lower dielectric material spacer that is L-shaped and an upper dielectric material spacer, wherein the lower dielectric material spacer has a horizontal portion that directly contacts a lower sidewall portion of the contact structure, and the upper dielectric material spacer has a vertical portion that directly contacts an upper sidewall portion of the contact structure, and wherein the contact structure passes through the horizontal portion of the lower dielectric spacer and a horizontal portion of the airgap spacer.

2. The semiconductor structure of claim 1, wherein the upper dielectric material spacer is also L-shaped, and the contact structure passes through a horizontal portion of the upper dielectric material spacer.

3. The semiconductor structure of claim 1, wherein the horizontal portion of the lower dielectric material spacer is adjacent to a bottom portion of the functional gate structure and extends onto a portion of the S/D region.

4. The semiconductor structure of claim 1, wherein the airgap spacer is sealed at a first end with a first airgap spacer cap and at a second end with a second airgap spacer cap.

5. The semiconductor structure of claim 4, wherein the first airgap spacer cap is located above an isolation structure that is located laterally adjacent to the semiconductor material portion, and the second airgap spacer cap is located at a top of the airgap spacer.

6. The semiconductor structure of claim 1, wherein a vertical portion of the lower dielectric material spacer is spaced apart from the functional gate structure by a dielectric material structure that is I-shaped and is composed of a dielectric material having a low dielectric constant.

7. The semiconductor structure of claim 1, further comprising a gate cap located on the functional gate structure and a dielectric cap located on the contact structure.

8. The semiconductor structure of claim 1, further comprising an interlayer dielectric material located laterally adjacent to the contact structure.

9. The semiconductor structure of claim 1, wherein the semiconductor material portion is located on a substrate, and the substrate is composed of a semiconductor material or an insulator material.

* * * * *